United States Patent
Itou et al.

(10) Patent No.: US 10,289,474 B2
(45) Date of Patent: May 14, 2019

(54) FIXING SYSTEM, SERVER, TERMINAL DEVICE, FIXING METHOD, AND RECORDING MEDIUM

(71) Applicant: FANUC CORPORATION, Yamanashi (JP)

(72) Inventors: Susumu Itou, Yamanashi (JP); Hitoshi Hirota, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 15/785,609

(22) Filed: Oct. 17, 2017

(65) Prior Publication Data
US 2018/0107533 A1   Apr. 19, 2018

(30) Foreign Application Priority Data
Oct. 19, 2016   (JP) .................................. 2016-205257

(51) Int. Cl.
*G06F 11/00*   (2006.01)
*G06F 11/07*   (2006.01)
(Continued)

(52) U.S. Cl.
CPC ........ *G06F 11/079* (2013.01); *G06F 11/0706* (2013.01); *G06F 11/0736* (2013.01); *G06F 11/0751* (2013.01); *G06F 11/0775* (2013.01); *G06F 11/0793* (2013.01); *G01R 13/0218* (2013.01); *G01R 23/16* (2013.01); *G06Q 10/20* (2013.01)

(58) Field of Classification Search
CPC ............... G06F 11/079; G06F 11/0706; G06F 11/0736; G06F 11/0751; G06F 11/0793
See application file for complete search history.

(56) References Cited

U.S. PATENT DOCUMENTS 6,742,141 B1 *  5/2004  Miller .................. G06F 11/0748
                                                              706/45
6,882,950 B1 *  4/2005  Jennion .......... G01R 31/318508
                                                              702/118
(Continued)

FOREIGN PATENT DOCUMENTS

CN      101625570     1/2010
JP      7-234987      9/1995
(Continued)

*Primary Examiner* — Michael Maskulinski
(74) *Attorney, Agent, or Firm* — Wenderoth, Lind & Ponack, L.L.P.

(57) ABSTRACT

In a fixing system, a first terminal device transmits information about a trouble in a target device to a server, receives information for restoration of the target device, and operates a measuring instrument for measurement on the target device to measure the state of the target device based on the information for restoration of the target device. The server receives the information about the trouble, and refers to a fixing know-how database to analyze the trouble. The fixing know-how database contains know-how information about fixing of the target device. The server selects information required for fixing from information for restoration specified based on a result of the analysis by a trouble analyzing unit so as to comply with a selection condition set in advance, and transmits the selected information to the first terminal device.

8 Claims, 9 Drawing Sheets

(51) Int. Cl.
*G01R 13/02* (2006.01)
*G01R 23/16* (2006.01)
*G06Q 10/00* (2012.01)

(56) References Cited

U.S. PATENT DOCUMENTS

| | | | | |
|---|---|---|---|---|
| 2009/0164853 A1* | 6/2009 | Gokhale | ............ | G06F 11/0709 |
| | | | | 714/57 |
| 2012/0089860 A1* | 4/2012 | Zaifman | ............ | G06F 11/0709 |
| | | | | 714/2 |
| 2014/0173350 A1* | 6/2014 | Roy | ............ | G06F 11/006 |
| | | | | 714/37 |
| 2015/0095709 A1* | 4/2015 | Ramachandra | ..... | G06F 11/3604 |
| | | | | 714/38.1 |
| 2016/0132372 A1* | 5/2016 | Anderson | ............ | G06F 11/079 |
| | | | | 714/15 |
| 2017/0308422 A1* | 10/2017 | Golash | ............ | G06F 11/079 |

FOREIGN PATENT DOCUMENTS

| | | |
|---|---|---|
| JP | 2009-116483 | 5/2009 |
| JP | 2013-30983 | 2/2013 |
| JP | 2014-50951 | 3/2014 |
| JP | 2014-163931 | 9/2014 |
| JP | 2016-100026 | 5/2016 |

* cited by examiner

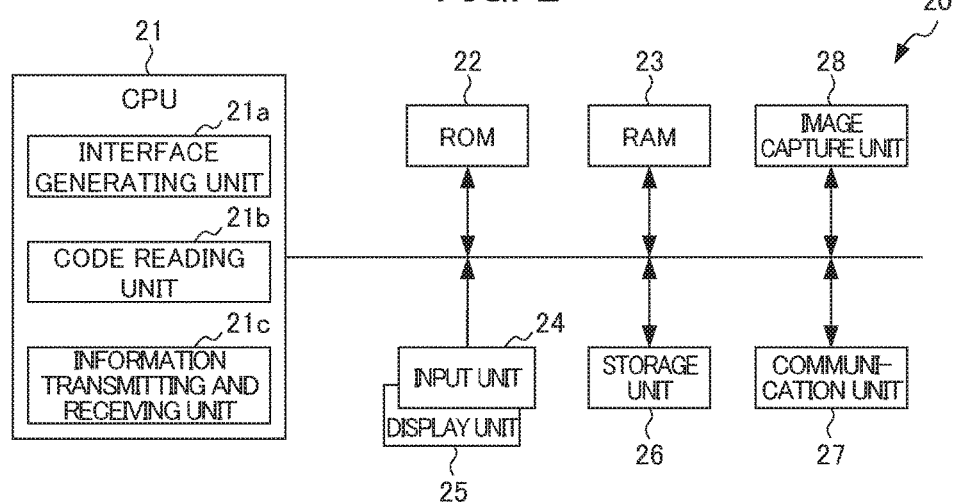
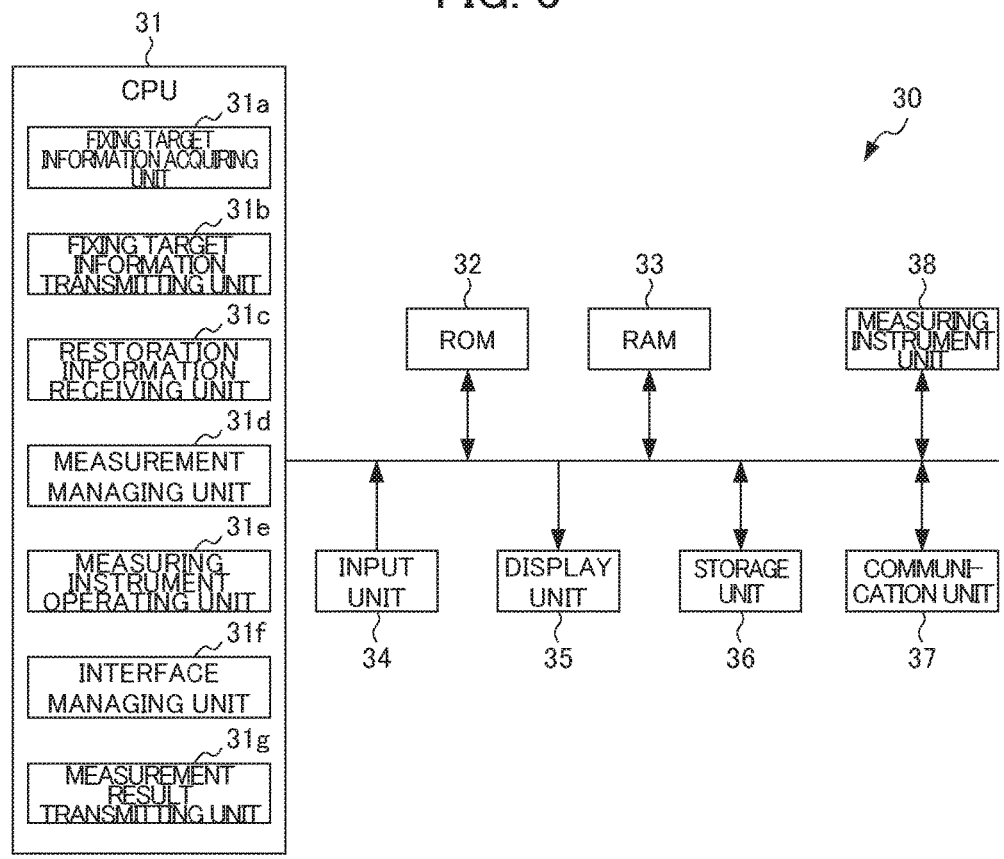

FIXING SYSTEM, SERVER, TERMINAL DEVICE, FIXING METHOD, AND RECORDING MEDIUM

This application is based on and claims the benefit of priority from Japanese Patent Application No. 2016-205257, filed on 19 Oct. 2016, the content of which is incorporated herein by reference.

BACKGROUND OF THE INVENTION

Field of the invention

The present invention relates to a fixing system, a server, a terminal device, a fixing method, and a recording medium.

Related Art

Work for fixing an industrial electric facility, a device with an electronic circuit, etc., has conventionally been done by an engineer having highly specialized knowledge. This work is to make measurement, etc., on a fixing target device using a general-purpose measuring instrument, for example, and to identify a trouble. If such work is to be done at a remote place from a business operator or a department responsible for maintenance and check of the device, particularly if the fixing target device is installed at a place beyond the sea, an operator at an actual place where the fixing target device is installed should be trained highly, and at the same time, technical information such as design information, etc. about the product should be brought into the actual place. A technique for maintenance and check of a device at a remote place is described in patent document 1, for example.

Patent Document 1: Japanese Unexamined Patent Application, Publication No. H07-234987

SUMMARY OF THE INVENTION

However, highly training the operator at the actual place where the fixing target device is installed or bringing the technical information such as design information, etc. about the product into the actual place causes risk of leakage of advanced knowledge information or outflow of an engineer (operator) having advanced knowledge. There also arises a problem in terms of cost required for training of the operator or nonuniform working efficiency due to difference in ability between operators. As described above, the conventional technique has had difficulty in responding to a trouble in the device at the remote place properly.

The present invention is intended to respond to a trouble in a device at a remote place more properly.

(1) To achieve the above-described object, a fixing system according to an aspect of the present invention (fixing system 1 described later, for example) comprises a server (server 40 described later, for example) and a first terminal device (restoration terminal 30 described later, for example) configured to allow communication with each other through a network. The server analyzes a trouble occurring in a target device (target device 10 described later, for example). The first terminal device measures the state of the target device. The first terminal device comprises: a fixing target information transmitting unit (fixing target information transmitting unit 31b described later, for example) that transmits information about the trouble in the target device to the server; a restoration information receiving unit (restoration information receiving unit 31c described later, for example) that receives information for restoration of the target device transmitted from the server; and a measuring instrument operating unit (measuring instrument operating unit 31e described later, for example) that operates a measuring instrument for measurement on the target device to measure the state of the target device based on the information for restoration of the target device. The server comprises: a fixing target information receiving unit (fixing target information receiving unit 41a described later, for example) that receives the information about the trouble in the target device; a trouble analyzing unit (trouble analyzing unit 41b described later, for example) that refers to a fixing know-how database to analyze the trouble occurring in the target device based on the information about the trouble in the target device, the fixing know-how database containing know-how information about fixing of the target device registered in advance; and a transmission information selecting unit (transmisson information selecting unit 41c described later, for example) that selects information required for fixing of the target device from information for restoration specified based on a result of the analysis by the trouble analyzing unit so as to comply with a selection condition set in advance, and transmits the selected information to the first terminal device.

(2) In the fixing system described in (1), the selection condition may be set in such a manner that the information for restoration specified based on the result of the analysis by the trouble analyzing unit is limited to information directly relating to fixing of the target device.

(3) In the fixing system described in (1) or (2), the transmission information selecting unit may select information for instructing work to be done by an operator at an actual place and the substance of automatic operation to be performed by the first terminal device for making measurement on the target device, and transmit the selected information as the information required for fixing of the target device to the first terminal device.

(4) The fixing system described in (3) may further comprise a second terminal device (tablet terminal 20 described later, for example) to be used by an operator of the target device. The first terminal device may comprise: an interface managing unit (interface managing unit 31f described later, for example) that manages information to be input to and output from a user interface displayed on the second terminal device. The interface managing unit may display the information for instructing work to be done by the operator on the user interface of the second terminal device. The information to be displayed is contained in the information required for fixing of the target device received from the server.

(5) In the fixing system described in (1) to (4), the measuring instrument provided in the first terminal device may be at least one of an oscilloscope, a digital I/O, a wavform generator, and a stabilized power supply.

(6) A server according to an aspect of the present invention is provided in a fixing system that comprises the server and a terminal device configured to allow communication with each other through a network. The server analyzes a trouble occurring in a target device. The terminal device measures the state of the target device. The server comprises: a fixing target information receiving unit that receives information about the trouble in the target device transmitted from the terminal device; a trouble analyzing unit that refers to a fixing know-how database to analyze the trouble occurring in the target device based on the information about the trouble in the target device, the fixing know-how database containing know-how information about fixing of the target device registered in advance; and a transmission information selecting unit that selects information required for fixing of the target device from information for restoration specified based on a result of the analysis by the trouble analyzing unit so as to comply with a selection condition set in advance, and transmits the selected information to the terminal device.

(7) A terminal device according to an aspect of the present invention is provided in a fixing system that comprises a server and the terminal device configured to allow communication with each other through a network. The server analyzes a trouble occurring in a target device. The terminal device measures the state of the target device. The terminal device comprises: a fixing target information transmitting unit that transmits information about the trouble in the target device to the server; a restoration information receiving unit that receives information for restoration of the target device transmitted from the server; and a measuring instrument operating unit that operates a measuring instrument for measurement on the target device to measure the state of the target device based on the information for restoration of the target device. The information for restoration of the target device is information required for fixing of the target device selected b; the server from information for restoration specified based on a result of analysis by the server so as to comply with a selection condition set in advance. The analysis is to analyze the trouble occurring in the target device by referring to a fixing know-how database based on the information about the trouble in the target device. The fixing know-how database contains know-how information about fixing of the target device registered in advance.

(8) A fixing method according to an aspect of the present invention is implemented in a fixing system comprising a server and a first terminal device configured to allow communication with each other through a network. The server analyzes a trouble occurring in a target device. The first terminal device measures the state of the target device. The first terminal device executes: a fixing target information transmitting step of transmitting information about the trouble in the target device to the server; a restoration information receiving step of receiving information for restoration of the target device transmitted from the server; and a measuring instrument operating step of operating a measuring instrument for measurement on the target device to measure the state of the target device based on the information for restoration of the target device. The server executes: a fixing target information receiving step of receiving the information about the trouble in the target device; a trouble analyzing step of referring to a fixing know-how database to analyze the trouble occurring in the target device based on the information about the trouble in the target device, the fixing know-how database containing no information about fixing of the target device registered in advance; and a transmission information selecting step of selecting information required for fixing of the target device from information for restoration specified based on a result of the analysis by the trouble analyzing step so as to comply with a selection condition set in advance, and transmitting the selected information to the first terminal device.

(9) A program according to an aspect of the present invention causes a computer to realize the following functions. The computer constitutes a server in a fixing system that comprises the server and a terminal device configured to allow communication with each other through a network. The server analyzes a trouble occurring in a target device. The terminal device measures the state of the target device. The functions comprise: a fixing target information receiving function of receiving information about the trouble in the target device transmitted from the terminal device; a trouble analyzing function of referring to a fixing know-how database to analyze the trouble occurring in the target device based on the information about the trouble in the target device, the fixing know-how database containing know-how information about fixing of the target device registered in advance; and a transmission information selecting function of selecting information required for fixing of the target device from information for restoration specified based on a result of the analysis by the trouble analyzing function so as to comply with a selection condition set in advance, and transmitting the selected information to the terminal device.

(10) A program according to an aspect of the present invention causes a computer to realize the following functions. The computer constitutes a terminal device in a fixing system that comprises a server and the terminal device configured to allow communication with each other through a network. The server analyzes a trouble occurring in a target device. The terminal device measures the state of the target device. The functions comprise: a fixing target information transmitting function of transmitting information about the trouble in the target device to the server; a restoration information receiving function of receiving information for restoration or the target device transmitted from the server; and a measuring instrument operating function of operating a measuring instrument for measurement on the target device to measure the state of the target device based on the information for restoration of the target device. The information for restoration of the target device is information required for fixing of the target device selected by the server from information for restoration specified based on a result of analysis by the server so as to comply with a selection condition set in advance. The analysis is to analyze the trouble occurring in the target device by referring to a fixing know-how database based on the information about the trouble in the target device. The fixing know-how database contains know-how information about fixing of the target device registered in advance.

According to the present invention, a trouble in a device at a remote place can be responded more properly.

BRIEF DESCRIPTION OF THE DRAWINGS

FIG. 2 is a block diagram showing the configuration of a tablet terminal;

FIG. 3 is a block diagram showing the configuration of restoration terminal;

DETAILED DESCRIPTION OF THE INVENTION

Figure 1:
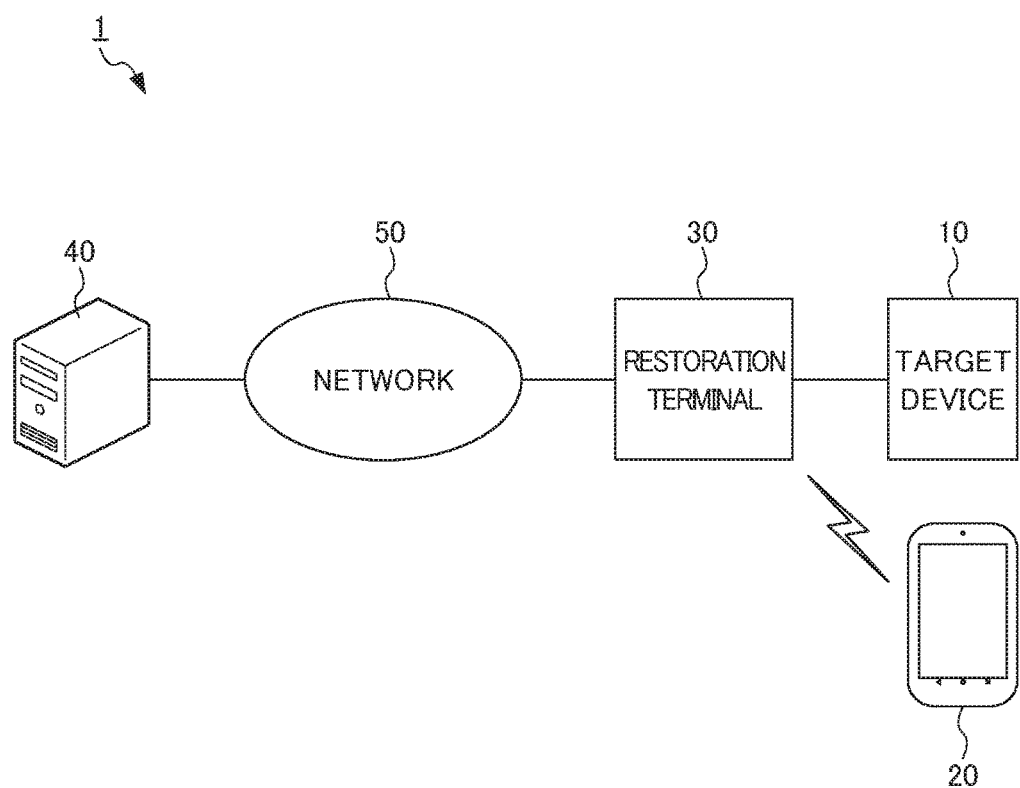
FIG. 1 is a schematic view showing the system configuration of a fixing system according to an embodiment of the present invention.

An embodiment of the present invention will be described below by referring to the drawings.

[Configuration]

FIG. 1 is a schematic view showing the system configuration of a fixing system 1 according to an embodiment of the present invention. As shown in FIG. 1, the fixing system 1 includes a target device 10, a tablet terminal 20, a restoration terminal 30, and a server 40. The restoration terminal 30 and the server 40 are configured to allow communication with each other through a network 50 such as the Internet or a virtual private network (VPN). The target device 10, the tablet terminal 20, and the restoration terminal 30 are configured to allow communication with each other through a network such as a wireless local area network (LAN) or a communication cable such as a universal serial bus (USB) cable.

The target device 10 is formed of an industrial electric facility such as a computer numerical control (CNC) device, for example. In this embodiment, the target device 10 is a target device for maintenance and check, and fixing in the fixing system 1. In this embodiment, the target device 10 is assumed to be installed at a remote place such as a different country or a different region from the server 40.

The tablet terminal 20 is formed of a tablet personal computer (PC) and is used by an operator at an actual place where the target device 10 is installed. The operator is allowed to check an instruction for restoration work or input data by reading a bar code assigned to the target device 10 using the tablet terminal 20 or displaying an interface screen for fixing on the tablet terminal 20.

FIG. 2 is a block diagram showing the configuration of the tablet terminal 20. As shown in FIG. 2, the tablet terminal 20 includes a central processing unit (CPU) 21, a ROM 22, a RAM 23, an input unit 24, a display unit 25, a storage unit 26, a communication unit 27, and an image capture unit 28. The CPU 21 executes various programs stored in the storage unit 26 to control the tablet terminal 20 entirely. For example, the CPU 21 executes a program for processing by which guidance on fixing of the target device 10 is given (hereinafter called "guidance processing"). The CPU 21 executes the program for the guidance processing, thereby forming the following functional units in the CPU 21 an interface generating unit 21a, a code reading unit 21b, and an information transmitting and receiving unit 21c.

The interface generating unit 21a generates a user interface screen for input and output of information for an operator, displays information about fixing of the target device 10, and accepts input of information from the operator. For example, in response to an instruction from the restoration terminal 30, the interface generating unit 21a displays the substance of an instruction for restoration work directed to the operator and accepts input of information from the operator about a trouble in the target device 10 (a symptom of the trouble, for example).

The code reading unit 21b reads a bar code (two-dimensional bar code, for example) assigned to the target device 10 to acquire information indicated by the bar code. The bar code assigned to the target device 10 contains encoded information for identifying the target device 10 such as the specification number, the serial number, etc. of the target device 10. The operator is allowed to input the information for identifying the target device 10 to the tablet terminal 20 by reading the bar code using the code reading unit 21b.

The information transmitting and receiving unit 21c controls communication of information to be transmitted and received between the tablet terminal 20 and the restoration terminal 30. For example, the information transmitting and receiving unit 21c transmits the information for identifying the target device 10 read by the code reading unit 21b and the information input from the operator about the trouble in the target device 10 to the restoration terminal 30 in response to operation by the operator. Further, the information transmitting and receiving unit 21c receives the substance of the instruction for restoration work directed to the operator transmitted from the restoration terminal 30.

The ROM 22 stores various system programs written in advance for control over the tablet terminal 20. The RAM 23 is formed of a semiconductor memory such as a dynamic random access memory (DRAM). The RAM 23 stores data generated during execution of various types of processing by the CPU 21. The input unit 24 is formed of an input unit such as a touch sensor. The input unit 24 accepts input of various types of information from a user to the tablet terminal 20.

The display unit 25 is formed of a display unit such as a liquid crystal display (LCD). The display unit 25 displays results of the various types of processing executed by the tablet terminal 20. In this embodiment, the input unit 24 is laid over the display unit 25 to form a touch panel. The storage unit 26 is formed of a nonvolatile storage unit such as a hard disk or a flash memory. The storage unit 26 stores the program for the guidance processing, etc. The communication unit 27 includes a communication interface such as a wireless LAN or a USB for executing signal processing based on a predetermined communication standard. The communication unit 27 controls communication of the tablet terminal 20 with the restoration terminal 30. The image capture unit 28 includes an image capture element such as a charge-coupled device (CCD). The image capture unit 28 outputs an image of a subject focused by a lens as data about a captured image.

Referring back to FIG. 1, the restoration terminal 30 is formed of an information processing device such as a PC with hardware having the function of making predetermined measurement on the target device 10. The restoration terminal 30 transmits information collected from the target device 10 to the server 40. Further, the restoration terminal 30 operates the target device 10 automatically in response to the substance of automatic operation received from the server 40. Further, the restoration terminal 30 transmits information received from the tablet terminal 20 to the server 40, and transmits guidance information about operation by an operator received from the server 40 to the tablet terminal 20.

FIG. 3 is a block diagram showing the configuration of the restoration terminal 30. As shown in FIG. 3, the restoration terminal 30 includes a CPU 31, a ROM 32, a RAM 33, an input unit 34, a display unit 35, a storage unit 36, a communication unit 37, and a measuring instrument unit 38. The CPU 31 executes various programs stored in the storage unit 36 to control the restoration terminal 30 entirely. For example, the CPU 31 executes a program for processing by which a procedure for restoration of the target device 10 is taken in response to an instruction from the server 40 (hereinafter called "restoration execution processing").

The CPU 31 executes the program for the restoration execution processing, thereby forming the following functional units in the CPU 31: a fixing target information acquiring unit 31a, a fixing target information transmitting unit 31b, a restoration information receiving unit 31c, a measurement managing unit 31d, a measuring instrument operating unit 31e, an interface managing unit 31f, and a measurement result transmitting unit 31g. The fixing target information acquiring unit 31a acquires information indicated by a bar code read by the tablet terminal 20. As a result, information for identifying the target device 10 (the specification number, the serial number, etc. of the target device 10) is acquired. Further, the fixing target information acquiring unit 31a acquires information input from an operator to the tablet terminal 20 about a trouble in the target device 10 (a symptom of the trouble, for example).

The fixing target information transmitting unit 31b transmits the following pieces of information (where appropriate, these pieces of information will collectively be called "fixing target information") to the server 40: the information for identifying the target device 10 acquired by the fixing target information acquiring unit 31a ; and the information about the trouble in the target device 10. The restoration information receiving unit 31c receives information for restoration of the target device 10 transmitted from the server 40 (this information will be called "restoration information"). The restoration information contains information for instructing work to be done by an operator and the substance of automatic operation to be performed by the restoration terminal 30. In this way, the information for instructing work to be done by an operator and the substance of automatic operation to be performed by the restoration terminal 30 are distinguished. This achieves restoration of the target device 10 without disclosing the substance of automatic operation to the operator. The measurement managing unit 31d changes a measurement mode of the restoration terminal 30 based on the restoration information (the substance of automatic operation to be performed by the restoration terminal 30) received by the restoration information receiving unit 31c. More specifically, the measurement managing unit 31d sets a measurement mode for measurement to be employed during the automatic operation among measurement modes for various types of measurements feasible by the restoration terminal 30.

The measuring instrument operating unit 31e operates a predetermined measuring instrument (such as an oscilloscope, a digital I/O, a waveform generator, or a stabilized power supply) by following the information for restoration of the target device 10 (the substance of automatic operation to be performed by the restoration terminal 30). Then, the measuring instrument operating unit 31e inputs information necessary for measurement such as a waveform (such as a voltage waveform obtained by the oscilloscope), a contact output (indicating ON or OFF of a relay contact, for example), or a test voltage to the target device 10, thereby measuring the state of the target device 10. The restoration terminal 30 can operate the measuring instrument through an interface employing an existing technique. For example, virtual instrument software architecture (VISA) technique is applicable.

The interface managing unit 31f manages information to be input to and output from a user interface of the tablet terminal 20. More specifically, the interface managing unit 31f displays the restoration information (the information for instructing work to be done by an operator) or the progress of restoration work on the user interface of the tablet terminal 20. Further, the interface managing unit 31f receives information input through the interface of the tablet terminal 20 from the tablet terminal 20.

The measurement result transmitting unit 31g transmits a measurement result indicating the state of the target device 10 measured by the measuring instrument operating unit 31e to the server 40. The ROM 32 stores various system programs written in advance for control over the restoration terminal 30. The RAM 33 formed of a semiconductor memory such as a DRAM. The RAM 33 stores data generated during execution of various types of processing by the CPU 31. The input unit 34 is formed of an input unit such as a keyboard, a mouse, or a touch panel. The input unit 34 accepts input of various types or information to the restoration terminal 30 from a user. The display unit 35 is formed of a display unit such as an LCD. The display unit 35 displays results of the various types of processing executed by the restoration terminal 30. In this embodiment, the input unit 34 and the display unit 35 may be omitted from the restoration terminal 30. Alternatively, the functions of these units may be implemented by the tablet terminal 20.

The storage unit 36 is formed of a nonvolatile storage unit such as a hard disk or a flash memory. The storage unit 36 stores the program for the restoration execution processing, etc. The communication unit 37 includes a communication interface such as a wired LAN, a wireless LAN, or a USB for executing signal processing based on a predetermined communication standard. The communication unit 37 controls communication of the restoration terminal 30 with the tablet terminal 20 and communication of the restoration terminal 30 through the network 50. The measuring instrument, unit 38 includes predetermined measuring instruments for measurement on the target device 10. In this embodiment, the measuring instruments provided in the measuring instrument unit 38 include an oscilloscope, a digital I/O, a waveform generator, or a stabilized power supply, etc. The type of the measuring instrument provided in the measuring instrument unit 38 is selectable appropriately in a manner that depends on the type of the target device 10, for example. As a result of provision of the measuring instrument unit 38 in the restoration terminal 30, various measurements can be made easily by connecting the restoration terminal 30 to the target device 10 while a trouble occurs in the target device 10.

Referring back to FIG. 1, the server 40 accumulates and stores know-how information (technical and knowledge information) about fixing of the target device 10. Based on this know-how information, the server 40 analyzes a trouble occurring in the target device 10. The server 40 selects minimum information required for fixing of the target device 10 and transmits the selected information to the restoration terminal 30. The minimum information required for fixing of the target device 10 mentioned herein contains information for instructing work to be done by an operator at an actual place and the substance of automatic operation to be performed by the restoration terminal 30 for making measurement on the target device 10. The minimum information is limited to information directly relating to fixing of the target device 10. As a result, the target device 10 can be fixed independently of the ability of an operator, while leakage of the know-how information can be prevented properly.

Figure 4:
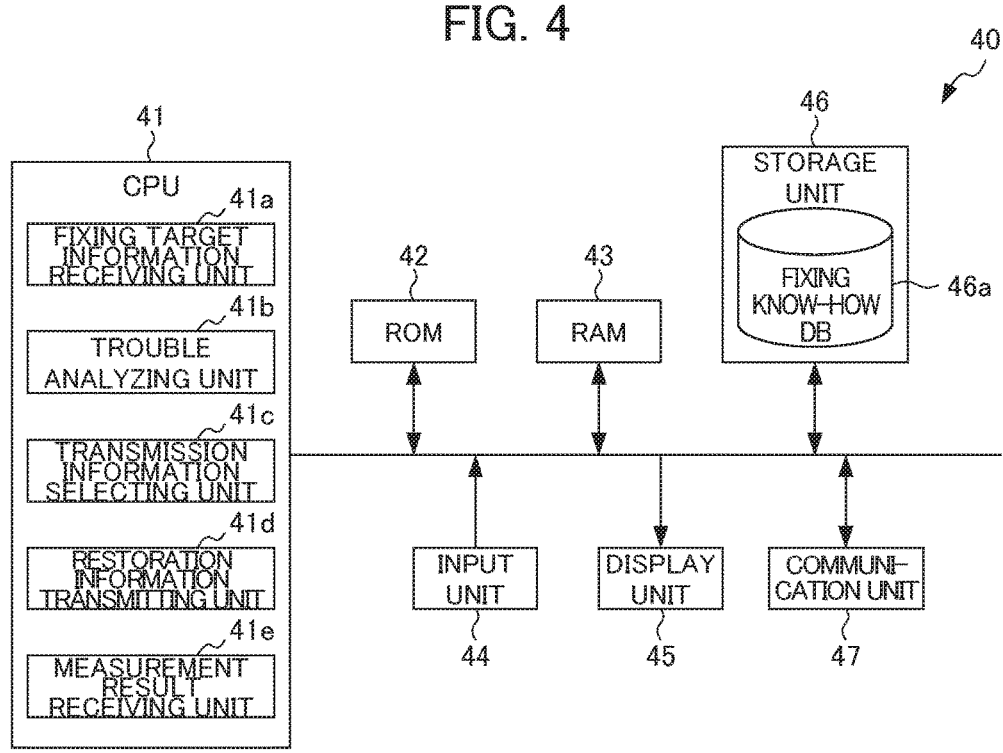
FIG. 4 is a block diagram showing the configuration of a server.

FIG. 4 is a block diagram showing the configuration of the server 40. As shown in FIG. 4, the server 40 includes a CPU 41, a ROM 42, a RAM 43, an input unit 44, a display unit 45, a storage unit 46, and a communication unit 47. The CPU 41 executes various programs stored in the storage unit 46 to control the server 40 entirely. For example, the CPU 41 executes a program for processing by which a trouble in the target device 10 is analyzed and a procedure for restoration is specified (hereinafter called "trouble analysis and restoration processing").

The CPU 41 executes the program for the trouble analysis and restoration processing, thereby forming the following functional units in the CPU 41: a fixing target information receiving unit 41a, a trouble analyzing unit 41b, a transmission information selecting unit 41c, a restoration information transmitting unit. 41d, and a measurement result receiving unit 41e. The fixing target information receiving unit 41a receives fixing target information transmitted from the restoration terminal 30.

The trouble analyzing unit 41b refers to a fixing know-how DB 16a described later to analyze a trouble occurring in the device 10 based on the filing target information received by the fixing target information receiving unit 41a. More specifically, the trouble analyzing unit. 41b reads know-how information about the target device 10 identified by the fixing target information from the fixing know-how DB 46a, and specifies any of the following procedures responsive to a symptom at the target device 10: operation to be performed by an operator on a fixing target; a method of connecting a measuring instrument, and remote and automatic operation on the target device 10, for example. Further, the trouble analyzing unit 41b refers to the fixing know-how DB 46a, analyzes the state of the target device 10 based on a result of measurement made by the restoration terminal 30 for restoration of the target device 10, and specifies a procedure for a method of fixing the target device 10.

In the procedure for restoration of the target device 10 specified by the trouble analyzing unit 41b, the transmission information selecting unit 41c selects minimum information required for fixing of the target device 10 (information for instructing work to be done by an operator at an actual place and the substance of automatic operation to be performed by the restoration terminal 30 for making measurement on the target device 10) so as to comply with a selection condition set in advance, and determines the selected information as restoration information to be transmitted to the restoration terminal 30. The selection condition can be set in such a manner that the restoration information is limited to information directly relating to fixing of the target device 10, as described above. By doing so, know-how, technical confidential information, etc. not opened to outsiders are excluded from an object of the selection. For example, the following information is not opened to outsiders and is excluded from an object of the selection correspondingly: a design matter that "multiple functions share a predetermined hardware resource in the target device 10," or the particular contents of a program such as firmware. For a procedure for restoration relating to these pieces of information, know-how, technical confidential information, etc. such as a fragmented working step and a task inherent in automatic operation are converted to a format that prohibits understanding in an actual place, and then incorporated in the restoration information.

The restoration information transmitting unit 41d transmits the restoration information selected by the transmission information selecting unit 41c to the restoration terminal 30.

The measurement result receiving unit 41e receives a measurement result indicating the state of the target device 10 transmitted from the restoration terminal 30. The ROM 42 stores various system programs written in advance for control over the server 40. The RAM 43 is formed of a semiconductor memory such as a DRAM. The RAM 43 stores data generated during execution of various types of processing by the CPU 41. The input unit 44 is formed of an input unit such as a keyboard, a mouse, or a touch panel. The input unit 44 accepts input of various types of information to the server 40 from a user. The display unit 45 is formed of a display unit such as an LCD. The display unit 45 displays results of the various types of processing executed by the server 40. In this embodiment, the input unit 44 and the display unit 45 may be omitted from the server 40. Alternatively, input and output to and from the server 40 may be controlled remotely by an external terminal.

The storage unit 46 is formed of a nonvolatile storage unit such as a hard disk or a flash memory. The storage unit 46 stores the program for the trouble analysis and restoration processing, etc. The storage unit 46 stores the fixing know-how database (fixing know-how DB) 46a containing know-how information about fixing of the target device 10 registered in advance. The fixing know-how DB 46a contains technical and knowledge information such as guidance for operation on a fixing target directed to an operator, an instruction for a method of connecting a measuring instrument, an instruction for remote and automatic operation on the target device 10, and an analyzing function of instructing a fixing method based on a measurement result. The communication unit 47 includes a communication interface such as a wired LAN, a wireless LAN, or a USB for executing signal processing based on a predetermined communication standard. The communication unit 47 controls communication of the server 40 through the network 50.

[Operation]

The operation of the fixing system 1 will be described next.

[Guidance Processing]

Figure 5:
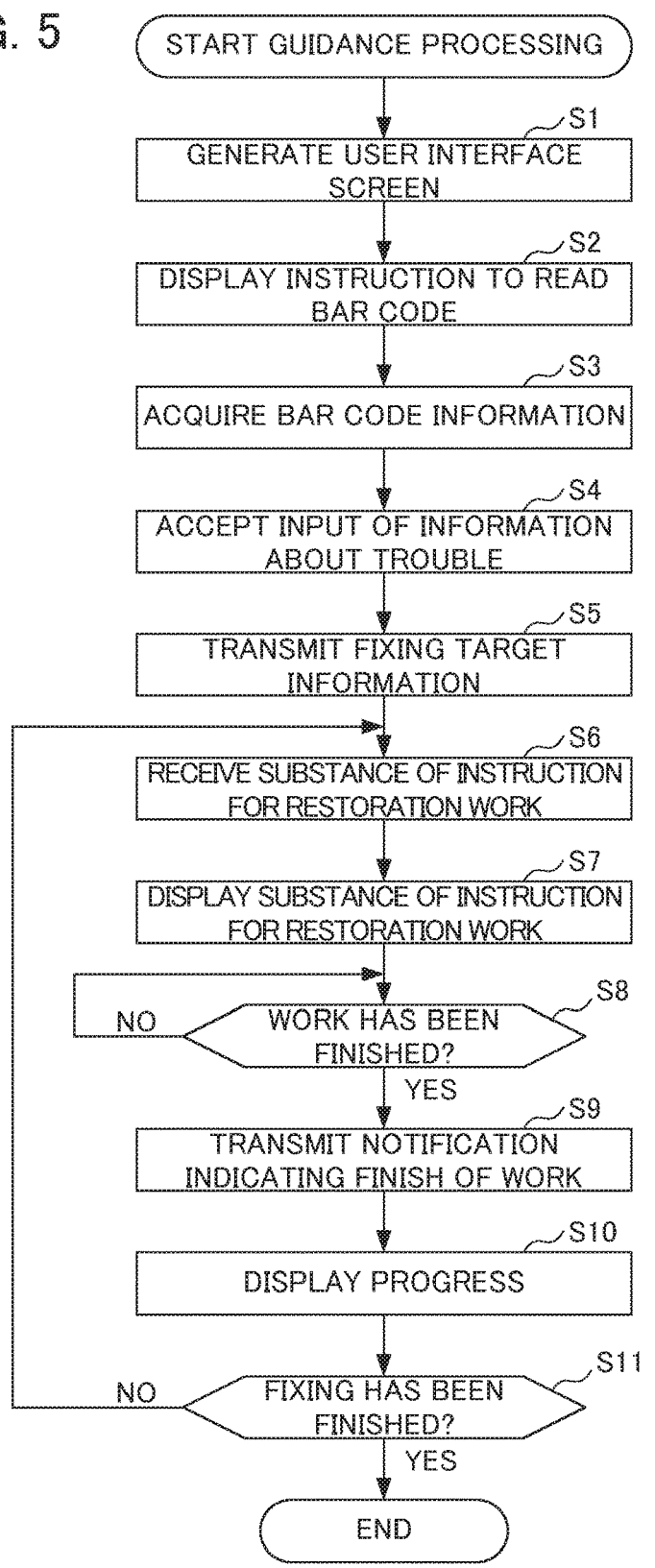
FIG. 5 is a flowchart explaining a flow of guidance processing executed by a CPU of the tablet terminal.

FIG. 5 is a flowchart explaining a flow of the guidance processing executed by the CPU 21 of the tablet terminal 20. FIGS. 6 to 11 are schematic diagrams each showing an example of a user interface screen displayed on the tablet terminal 20 during the guidance processing. The flow of the guidance processing will be explained below by referring to FIGS. 6 to 11 appropriately.

The guidance processing is started by input of an instruction to start the guidance processing through the input unit 24. If the guidance processing is started, the interface generating unit 21a generates a user interface screen for input and output of information for an operator in step S1. In step S2, the interface generating unit 21a displays a message including an instruction directed to the operator to read a bar code assigned to the target device 10 where a trouble occurs.

In step S3, the code reading unit 21b reads the bar code assigned to the target device 10 to acquire information indicated by the bar code. In step S4, the interface generating unit 21a accepts input of information from the operator about the trouble in the target device 10 (such as a symptom of the trouble).

Figure 6:
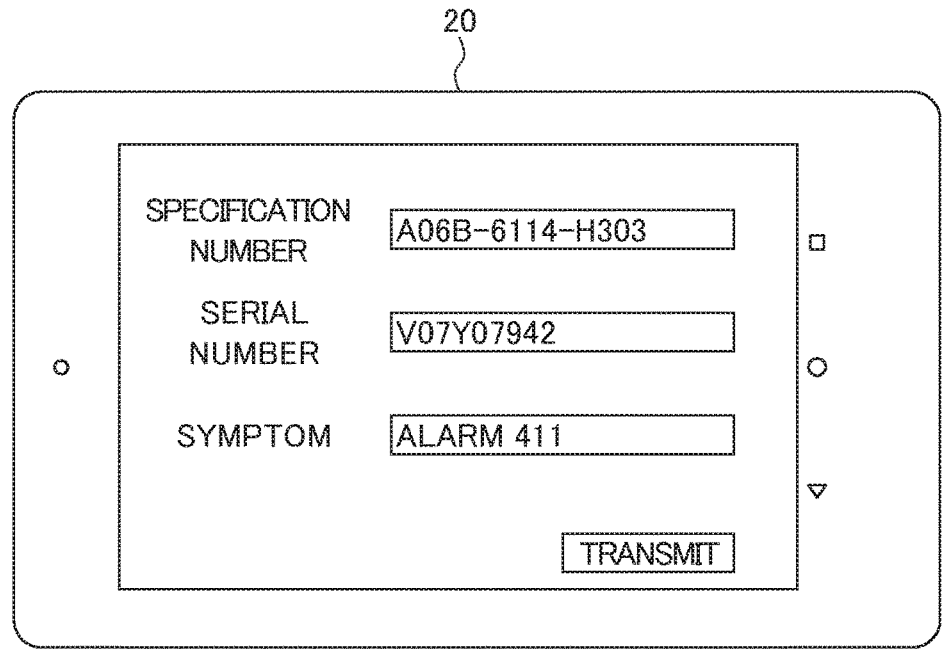
FIG. 6 is a schematic view showing an example of a user interface screen to which information for identifying a target device and a symptom of a trouble are input.

FIG. 6 is a schematic view showing an example of a user interface screen to which information for identifying the target device 10 and the symptom of the trouble are input. The information for identifying the target device 10 input to the user interface screen of FIG. 6 includes the specification number and the serial number of the target device 10 acquired by reading the code. The information about the trouble in the target device 10 input to this user interface screen is a code (alarm 411) indicating the symptom. In step S5, the information transmitting and receiving unit 21c transmits the information for identifying the target device 10 read by the code reading unit 21b and the information input from the operator about the trouble in the target device 10 (fixing target information) to the restoration terminal 30 in response to operation by the operator (tap on a send button, for example).

In step S6, the information transmitting and receiving unit 21c receives the substance of an instruction for restoration work directed to the operator transmitted from the restoration terminal 30. In step S7, the interface generating unit 21a displays a message including the substance of the instruction for restoration work directed to the operator transmitted from the restoration terminal 30.

Figure 7:
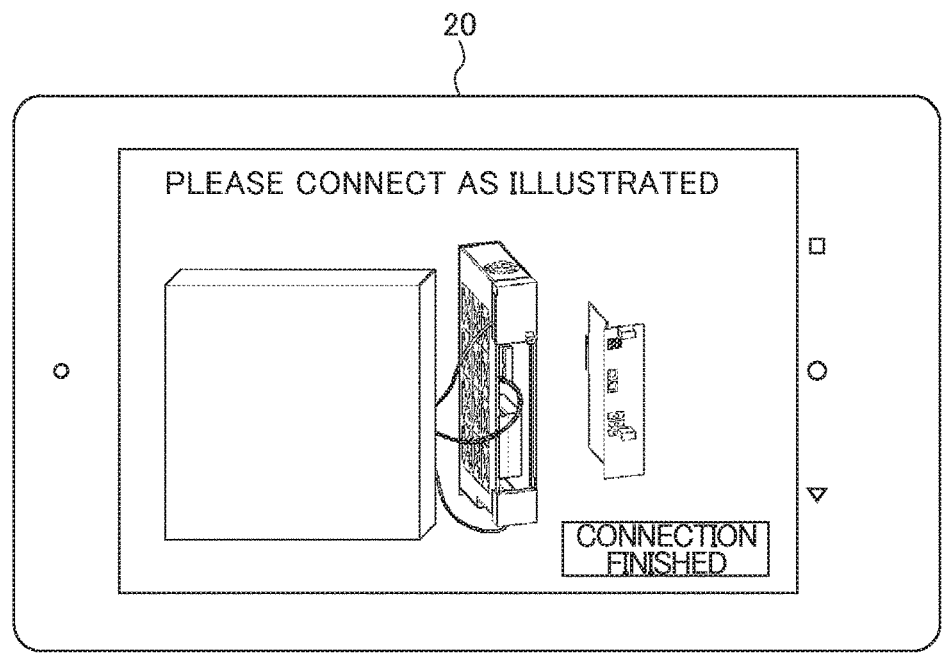
FIG. 7 is a schematic view showing an example of a user interface screen on which a message including the substance of an instruction for restoration work directed to an operator (an instruction for preparation for measurement) is displayed.
Figure 8:
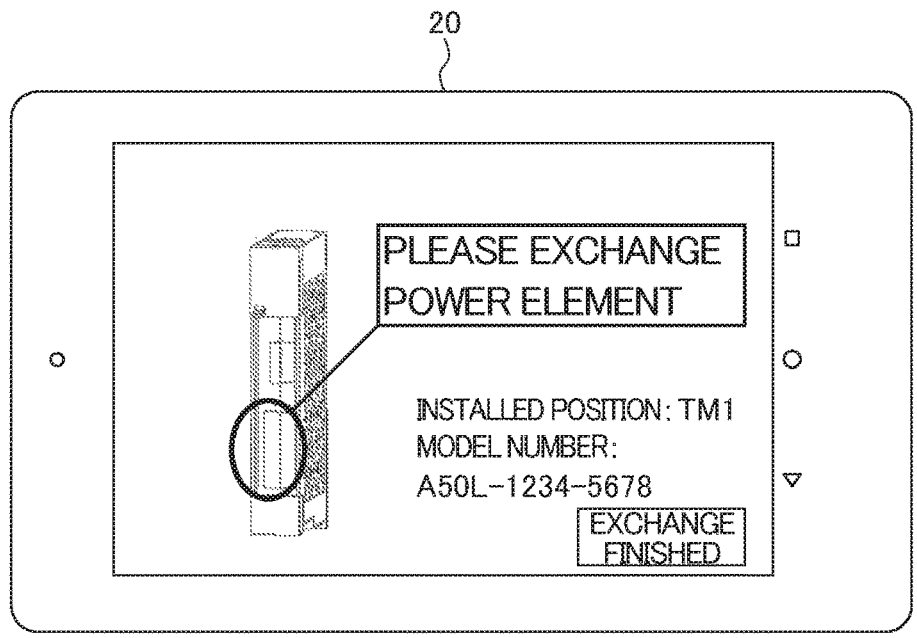
FIG. 8 is a schematic view showing an example of a user interface screen on which a message including the substance of the instruction for restoration work directed to the operator (an instruction for fixing) is displayed.

FIG. 7 is a schematic view showing an example of a user interface screen on which the message including the substance of the instruction for restoration work directed to the operator (an instruction for preparation for measurement) is displayed. The user interface screen of FIG. 7 gives an instruction to the operator with drawings showing a method of connecting the restoration terminal 30 and the target device 10 for making measurement on the target device 10. FIG. 8 is a schematic view showing an example of a user interface screen on which a message including the substance of the instruction for restoration work directed to the operator (an instruction for fixing) is displayed. The user interface screen of FIG. 8 gives an instruction to the operator with drawings showing a particular method of replacing a part of the target device 10 for removing the trouble and restoring the target device 10.

In step S8, the interface generating unit 21a determines whether or not the operator has given an input (such as tap on a connection finish button) showing finish of the work corresponding to the substance of the instruction for restoration work. If the operator has not given an input showing finish of the work corresponding to the substance of the instruction for restoration work, a determination in step S8 is NO. Then, step S8 is repeated. If the operator has given an input showing finish of the work corresponding to the substance of the instruction for restoration work, a determination in step S8 is YES. Then, the processing shifts to step S9.

In step S9, the information transmitting and receiving unit 21c transmits a notification to the restoration terminal 30 indicating that the work corresponding to the substance of the instruction for restoration work has been finished. In step S10, the interface generating unit 21a displays progress of the restoration work transmitted from the restoration terminal 30 successively.

Figure 9:
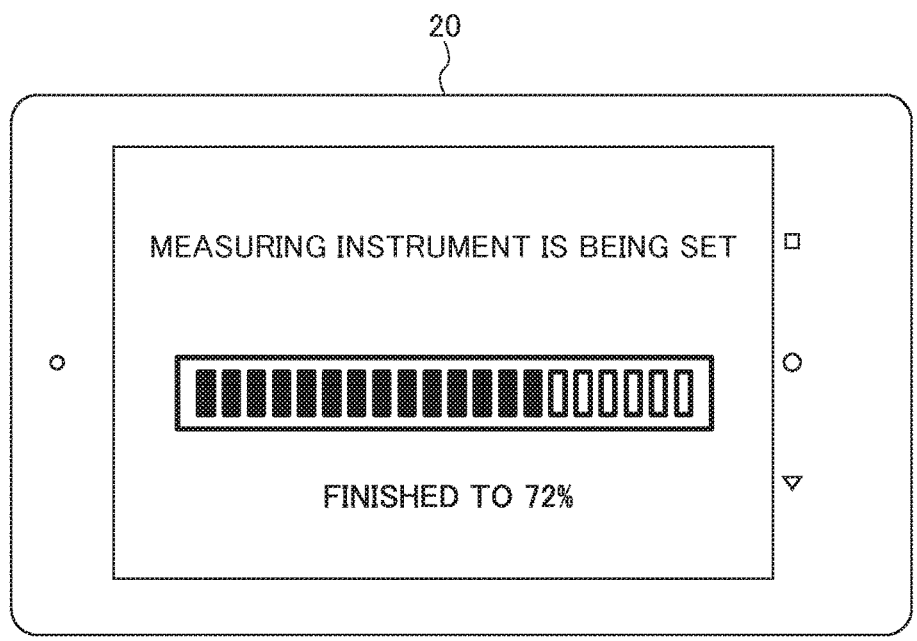
FIG. 9 is a schematic view showing an example of a user interface screen on which a message indicating that a measuring instrument of the restoration terminal is being set by remote control is displayed.
Figure 10:
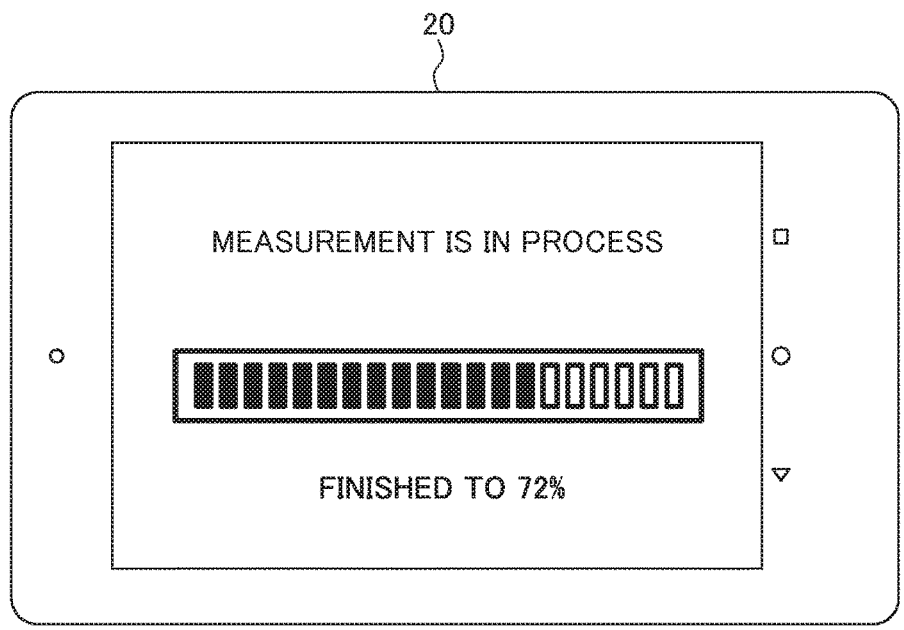
FIG. 10 is a schematic view showing an example of a user interface screen on which a message indicating that measurement is in process with the remotely controlled measuring instrument of the restoration terminal is displayed.
Figure 11:
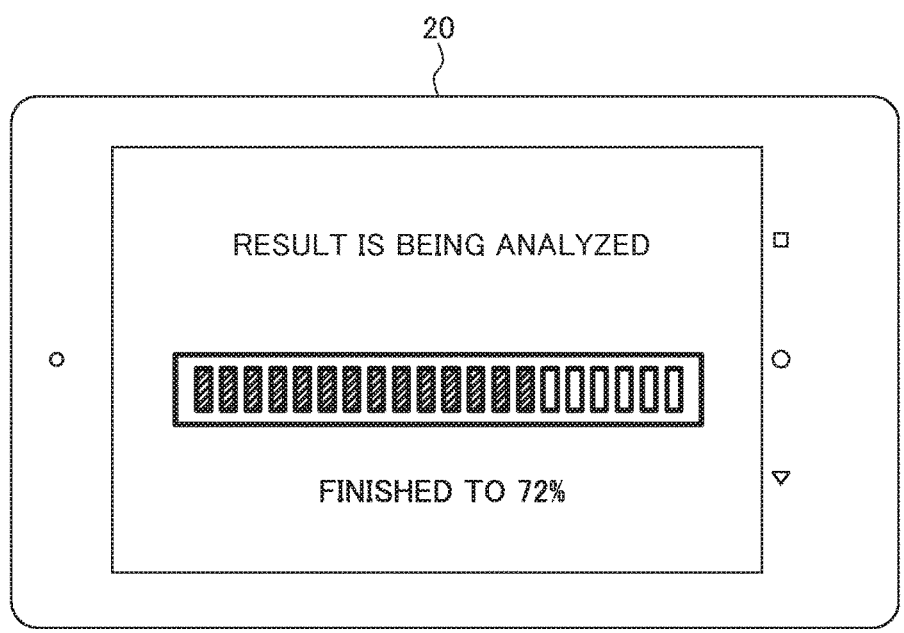
FIG. 11 is a schematic view showing an example of a user interface screen on which a message indicating that a trouble in the target device is being analyzed is displayed.

FIG. 9 is a schematic view showing an example of a user interface screen on which a message indicating that a measuring instrument of the restoration terminal 30 is being set by remote control is displayed. FIG. 10 is a schematic view showing an example of a user interface screen on which a message indicating that measurement, is in process with the remotely controlled measuring instrument of the restoration terminal 30 is displayed. FIG. 11 is a schematic view showing an example of a user interface screen on which a message indicating that the trouble occurring in the target device 10 is being analyzed is displayed. The content of the display on the user interface screen shown in each of FIGS. 9 to 11 is updated on an as-needed basis based on the progress of the restoration work notified to the restoration terminal 30 from the server 40.

In step S11, the interface generating unit 21a determines whether or not a notification indicating finish of fixing of the target device 10 has been received from the restoration terminal 30. If a notification indicating finish of fixing of the target device 10 has not been received from the restoration terminal 30, a determination in step S11 is NO. Then, the processing shifts to step S6. If a notification indicating finish of fixing of the target device 10 has been received from the restoration terminal 30, a determination in step S11 is YES. Then, the guidance processing is finished.

[Restoration Execution Processing]

Figure 12:
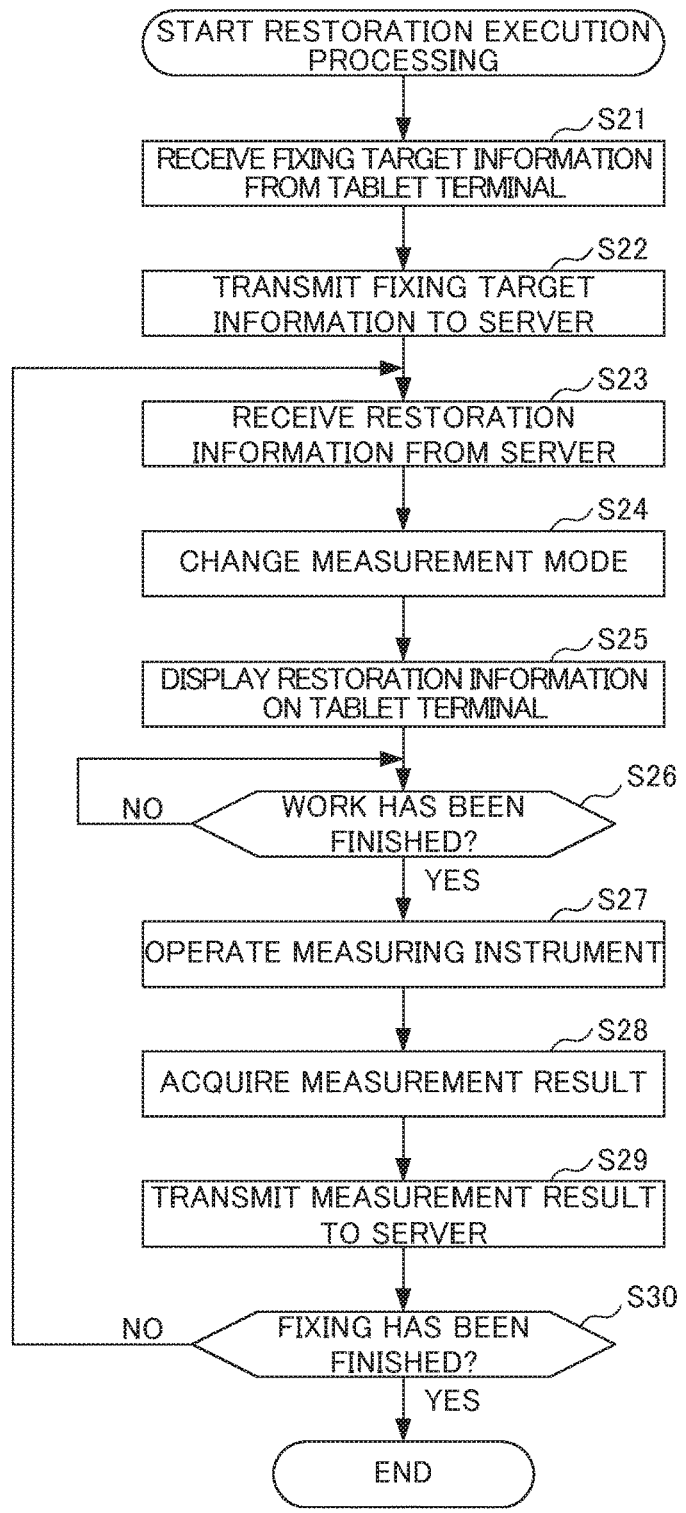
FIG. 12 is a flowchart explaining a flow of restoration execution processing executed by a CPU of the restoration terminal.

FIG. 12 is a flowchart explaining a flow of the restoration execution processing executed by the CPU 31 of the restoration terminal 30. The restoration execution processing is started by input of an instruction to start the restoration execution processing through the input unit 34. If the restoration execution processing is started, in step S21, the fixing target information acquiring unit 31a receives information for identifying the target device 10 and information about a trouble in the target device 10 (fixing target information) transmitted from the tablet terminal 20.

In step S22, the fixing target information transmitting unit 31b transmits the fixing target information to the server 40. In step S23, the restoration information receiving unit 31c receives restoration information transmitted from the server 40. In step S24, the measurement managing unit 31d changes a measurement mode of the restoration terminal 30 based on the restoration information (the substance of automatic operation to be performed by the restoration terminal 30) received by the restoration information receiving unit 31c.

In step S25, the interface managing unit 31f displays the restoration information (information for instructing work to be done by an operator) on the user interface of the tablet terminal 20. In step S26, the interface managing unit 31f determines whether or not a notification indicating finish of work corresponding to the substance of an instruction for restoration work has been received from the tablet terminal 20. If a notification indicating finish of the work corresponding to the substance of the instruction for restoration work has not been received from the tablet terminal 20, a determination in step S26 is NO. Then, step S26 is repeated. If a notification indicating finish of the work corresponding to the substance of the instruction for restoration work has been received from the tablet terminal 20, a determination in step S26 is YES. Then, the processing shifts to step S27.

In step S27, the measuring instrument operating unit 31e operates a predetermined measuring instrument (such as the oscilloscope or the waveform generator) by following the information for restoration of the target device 10 (the substance of automatic operation to be performed by the restoration terminal 30). Then, the measuring instrument operating unit 31e inputs information necessary for measurement such as a waveform, a contact output, or a test voltage to the target device 10. In step S28, the measuring instrument operating unit 31e acquires a result of the measurement obtained by the predetermined measuring instrument (such as the oscilloscope or the waveform generator). In step S29, the measurement result transmitting unit 31g transmits the result of the measurement indicating the state of the target device 10 obtained by the measuring instrument operating unit 31e to the server 40. In step S30, the measurement managing unit 31d determines whether or not fixing of the target device 10 has been finished. If fixing of the target device 10 has not been finished, a determination in step S30 is NO. Then, the processing shifts to step S23. If fixing of the target device 10 has been finished, a determination in step S30 is YES. Then, the restoration execution processing is finished.

[Trouble Analysis and Restoration Processing]

Figure 13:
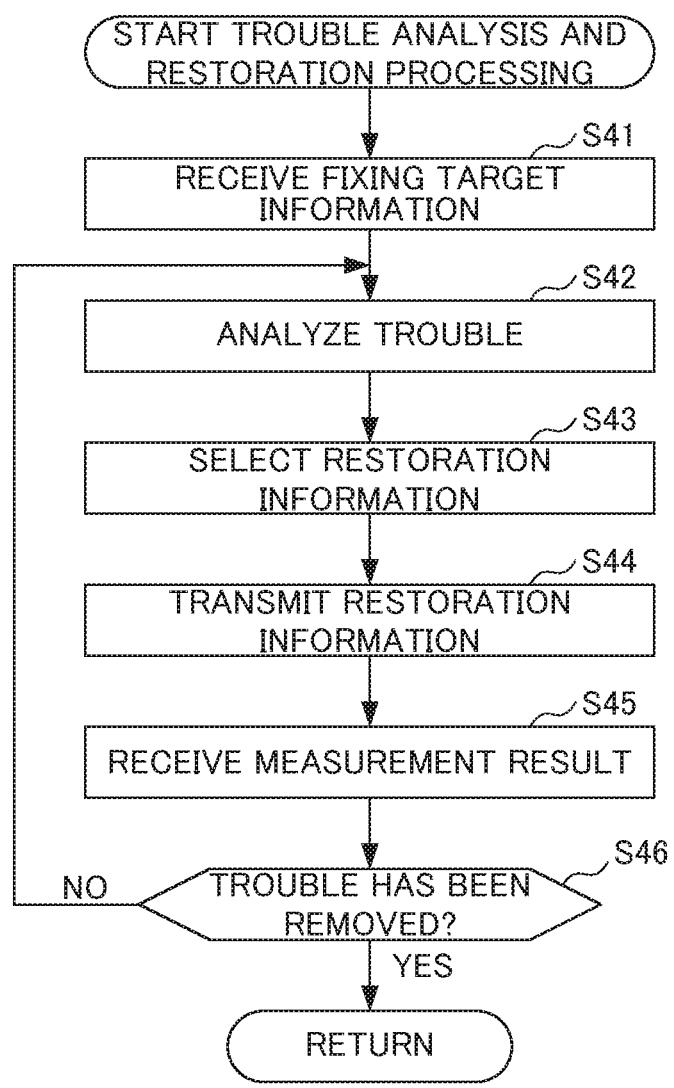
FIG. 13 is a flowchart explaining a flow of trouble analysis and restoration processing executed by a CPU of the server.

FIG. 13 is a flowchart explaining a flow of the trouble analysis and restoration processing executed by the CPU 41 of the server 40. The trouble analysis and restoration processing is started by input of an instruction to start the trouble analysis and restoration processing through the input unit 44. If the trouble analysis and restoration processing is started, the fixing target information receiving unit 41*a* receives fixing target information in step S41 transmitted from the restoration terminal 30.

In step S42, the trouble analyzing unit 41*b* refers to the fixing know-how DB 46*a* to analyze a trouble occurring in the target device 10 based on the fixing target information received by the fixing target information receiving unit 41*a*. In step S43, in a procedure for restoration of the target device 10 specified by the trouble analyzing unit 41*b*, the transmission information selecting unit 41*c* selects minimum information required for fixing of the target device 10 (information for instructing work to be done by an operator at an actual place and the substance of automatic operation to be performed by the restoration terminal 30 for making measurement on the target device 10) so as to comply with a selection condition set in advance, and determines the selected information as restoration information to be transmitted to the restoration terminal 30.

In step S41, the restoration information transmitting unit 41*d* transmits the restoration information selected by the transmission information selecting unit 41*c* to the restoration terminal 30. In S45, the measurement result receiving unit 41*e* receives a measurement result indicating the state of the target device 10 transmitted from the restoration terminal 30. In step S46, the trouble analyzing unit 41*b* determines whether or not the trouble occurring in the target device 10 has been removed. If the trouble occurring in the target device 10 has not been removed, a determination in step S46 is NO. Then, the processing shifts to step S42. If the trouble occurring in the target device 10 has been removed, a determination in step S46 is YES. Then, the trouble analysis and restoration processing is repeated.

As described above, if a trouble occurs in the target device 10, the fixing system 1 according to this embodiment makes the server 40 with the fixing know-how DB 46*a* analyze the trouble occurring in the target device 10. In a procedure for restoration of the target device 10, the server 40 selects minimum information required for fixing of the target device 10, and transmits the selected information as restoration information to the restoration terminal 30. Then, the restoration terminal 30 transmits information contained in the restoration information and intended for instructing work to be done by an operator to the tablet terminal 20. The operator of the tablet terminal 20 does restoration work by following a procedure displayed on the tablet terminal 20. The restoration terminal 30 operates a predetermined measuring instrument based on the substance of automatic operation to be performed by the restoration terminal 30 contained. In the restoration information to measure the state of the target device 10. The restoration terminal 30 transmits a result of the measurement indicating the state of the target device 10 to the server 40. The foregoing processing is repeated until the trouble in the target device 10 is removed.

As a result, even an operator without advanced knowledge is still allowed to do work based on the know-how of an engineer having advanced knowledge. Further, the target device 10 can be fixed without causing leakage of advanced knowledge. Further, cost required for training of the operator or nonuniform working efficiency due to difference in ability between operators can be reduced. Additionally, risk of outflow of an engineer (operator) having advanced knowledge can be reduced. Thus, according to the present invention, a trouble in a device at a remote place can be responded more properly.

Employing the fixing system 1 according to this embodiment achieves automated operation of a testing device requiring specialized knowledge for its complicated operation. Examples of operation allowed to be performed automatically include parameter setting for a servo amplifier testing device, selection of control axes, full axis reference position return, and selection and start of a test program. Further, while the restoration terminal 30 measures the state of the target device 10, an error can be detected by monitoring a parameter changing successively (such as a current flowing in a motor or a voltage at part of a servo amplifier), and comparing the monitored parameter with a value or a waveform in a normal state, for example. By accumulating measurement data acquired by the monitoring in the fixing know-how DB 46*a* and analyzing the accumulated data, an error can be detected with a higher degree of precision than in a conventional case. As another example, a test program for a testing device for a CNC substrate can be selected and set automatically. By referring to the fixing know-how DB 46*a*, a failed part can be estimated based on a test result and an operator can be instructed to replace the failed part.

[First Modification]

In the above-described embodiment, an engineer having advanced knowledge may make auxiliary action by hand to track or remove a trouble occurring in the target device 10 through the network 50 doing so, even in a situation where the trouble cannot be removed easily by analysis of the trouble by the server 40, for example, the trouble occurring in the target device 10 can be removed by analysis or remote control by the engineer having advanced knowledge.

[Second Modification]

In the above-described embodiment, the user interface to be displayed on the tablet terminal 20 can be changed in a manner that depends on the degree of skill of an operator. In the case of an unskilled operator, for example, a user interface to be displayed can be determined in such a manner that the range or type of operation feasible by the operator is limited compared to a conventional range or type to conform to the degree of skill of this operator. By doing so, restoration work can be done easily by an operator of a different degree of skill while the target device 10 is not required to take particular action.

[Third Modification]

In the above-described embodiment, the substance of work allowed to be done by an operator can be set in a manner that depends on the personal circumstance or degree of skill of the operator. For example, the operation of a machine to be controlled may be limited by inputting various numerical values to the target device 10. In this case, if the operator inputs an erroneous numerical value, the machine may make an unexpected motion (such as excessive motion) to cause the likelihood of malfunction of the machine. In contrast, by setting the substance of work (such as an acceptable range of a numerical value) allowed to be done by the operator in a manner that depends on the personal circumstance or degree of skill of the operator, the occurrence of malfunction in the machine due to incorrect operation can be prevented.

In the example given in the above-described embodiment, the server 40 includes the fixing know-how DB 46*a*. However, the present invention is not limited to this example. For example, the fixing know-how DB 46*a* may be mounted on a server on the network 50 different from the server 40. In this case, the server 40 may refer to the fixing know-how DB 46*a* through the network 50, if necessary. In the example given in the above-described embodiment, the restoration terminal 30 includes the measuring instrument unit 38. However, the present invention is not limited to this example. For example, the restoration terminal 30 can use a measuring instrument provided in the target device 10 or a measuring instrument placed at an actual place where the target device 10 is installed.

The function of the fixing system 1 according to the above-described embodiment can be realized entirely or partially by hardware, by software, or by a combination of hardware and software. Being realized by software means being realized by execution of a program by a processor. To configure the fixing system 1 by hardware, the function of the fixing system 1 can be configured partially or entirely by using an integrated circuit (IC) such as an application specific integrated circuit (ASIC), a gate array, a field-programmable gate array (FPGA), or a complex programmable logic device (CPLD), for example.

The function of the fixing system 1 can also be configured entirely or partially by software in a computer including a storage unit such as a hard disk or a ROM storing programs describing all or part of the operation of the fixing system 1, a DRAM storing data required for calculation, a CPU, and a bus for connection between the units. In this computer, the function of the fixing system 1 can be realized by storing information necessary for calculation into the DRAM and making the CPU execute the programs.

These programs can be stored. In various types of computer-readable media and can be supplied to the computer. The computer-readable media include various types of tangible storage media. Examples of the computer-readable media include a magnetic recording medium (a flexible disk, magnetic tape, or a hard disk drive, for example), a magneto-optical recording medium (a magneto-optical disk, for example), a CD read-only memory (CD-ROM), a CD-R, a CD-R/W, and a semiconductor memory (a mask ROM, a programmable ROM (PROM), an erasable PROM (EPROM), a flash memory, or a random access memory (RAM), for example). These programs may be distributed by being downloaded onto a computer of a user through a network.

While the embodiment of the present invention has been described in detail above, this embodiment is merely a specific example employed for implementing the present invention. The technical scope of the present invention is not to be limited to the above-described embodiment. Various changes of the present invention can be devised without departing from the substance of the invention. These changes are also covered by the technical scope of the present invention.

EXPLANATION OF REFERENCE NUMERALS

1 Fixing system
10 Target device
20 Tablet terminal
21, 31, 41 CPU
21*a* Interface generating unit
21*b* Code reading unit
21*c* Information transmitting and receiving unit
22, 32, 42 ROM
23, 33, 43 RAM
24, 34, 44 Input unit
25, 35, 45 Display unit
26, 36, 46 Storage unit
27, 37, 47 Communication unit
28 image capture unit
30 Restoration terminal
31*a* Fixing target information acquiring unit
31*b* Fixing target information transmitting unit
31*c* Restoration information receiving unit
31*d* Measurement managing unit
31*e* Measuring instrument operating unit
31f Interface managing unit
31g Measurement result transmitting unit
36 Measuring instrument unit
40 Server
41*a* Fixing target information receiving unit
41*b* Trouble analyzing unit
41*c* Transmission information selecting unit
41*d* Restoration information transmitting unit
41*e* Measurement result receiving unit
46*a* Fixing know-how database (fixing know-how DB)
50 Network

What is claimed is:

1. A fixing system comprising a server and a first terminal device configured to allow communication with each other through a network, the server analyzing a trouble occurring in a target device, the first terminal device measuring a state of the target device,
the first terminal device comprising:
a fixing target information transmitting unit that transmits information about the trouble in the target device to the server;
a restoration information receiving unit that receives information for restoration of the target device transmitted from the server; and
a measuring instrument operating unit that operates a measuring instrument for measurement on the target device to measure the state of the target device based on the information for restoration of the target device,
the server comprising:
a fixing target information receiving unit that receives the information about the trouble in the target device;
a trouble analyzing unit that refers to a fixing know-how database to analyze the trouble occurring in the target device based on the information about the trouble in the target device, the fixing know-how database containing know-how information about fixing of the target device registered in advance; and
a transmission information selecting unit that selects information required for fixing of the target device from information for restoration specified based on a result of the analysis by the trouble analyzing unit so as to comply with a selection condition set in advance, and transmits the selected information to the first terminal device, wherein
the selection condition is set in such a manner that the information for restoration specified based on the result of the analysis by the trouble analyzing unit is limited to information directly relating to fixing of the target device and excluding know-how and technical confidential information not opened to outsiders; and
the transmission information selecting unit selects information for instructing work to be done by an operator at an actual place and a substance of automatic operation to be performed by the first terminal device for making measurement on the target device, and transmits the selected information as the information required for fixing of the target device to the first terminal device.

2. The fixing system according to claim 1, further comprising a second terminal device to be used by an operator of the target device, wherein
the first terminal device comprises:
an interface managing unit that manages information to be input to and output from a user interface displayed on the second terminal device, and
the interface managing unit displays the information for instructing work to be done by the operator on the user interface of the second terminal device, the information to be displayed being contained in the information required for fixing of the target device received from the server.

3. The fixing system according to claim 1, wherein the measuring instrument provided in the first terminal device is at least one of an oscilloscope, a digital I/O, a waveform generator, and a stabilized power supply.

4. A server in a fixing system that comprises the server and a terminal device configured to allow communication with each other through a network, the server analyzing a trouble occurring in a target device, the terminal device measuring a state of the target device, the server comprising:
a fixing target information receiving unit that receives information about the trouble in the target device transmitted from the terminal device;
a trouble analyzing unit that refers to a fixing know-how database to analyze the trouble occurring in the target device based on the information about the trouble in the target device, the fixing know-how database containing know-how information about fixing of the target device registered in advance; and
a transmission information selecting unit that selects information required for fixing of the target device from information for restoration specified based on a result of the analysis by the trouble analyzing unit so as to comply with a selection condition set in advance, and transmits the selected information to the terminal device, wherein
the selection condition is set in such a manner that the information for restoration specified based on the result of the analysis by the trouble analyzing unit is limited to information directly relating to fixing of the target device and excluding know-how and technical confidential information not opened to outsiders; and
the transmission information selecting unit selects information for instructing work to be done by an operator at an actual place and a substance of automatic operation to be performed by the terminal device for making measurement on the target device, and transmits the selected information as the information required for fixing of the target device to the terminal device.

5. A terminal device in a fixing system that comprises a server and the terminal device configured to allow communication with each other through a network, the server analyzing a trouble occurring in a target device, the terminal device measuring a state of the target device, the terminal device comprising:
a fixing target information transmitting unit that transmits information about the trouble in the target device to the server;
a restoration information receiving unit that receives information for restoration of the target device transmitted from the server; and
a measuring instrument operating unit that operates a measuring instrument for measurement on the target device to measure the state of the target device based on the information for restoration of the target device, wherein
the information for restoration of the target device is information required for fixing of the target device selected by the server from information for restoration specified based on a result of analysis by the server so as to comply with a selection condition set in advance, the analysis being to analyze the trouble occurring in the target device by referring to a fixing know-how database based on the information about the trouble in the target device, the fixing know-how database containing know-how information about fixing of the target device registered in advance;
the selection condition is set in such a manner that the information for restoration specified based on the result of the analysis is limited to information directly relating to fixing of the target device and excluding know-how and technical confidential information not opened to outsiders; and
information for instructing work to be done by an operator at an actual place and a substance of automatic operation to be performed by the terminal device for making measurement on the target device are selected.

6. A fixing method implemented in a fixing system comprising a server and a first terminal device configured to allow communication with each other through a network, the server analyzing a trouble occurring in a target device, the first terminal device measuring a state of the target device,
the first terminal device executing:
a fixing target information transmitting step of transmitting information about the trouble in the target device to the server;
a restoration information receiving step of receiving information for restoration of the target device transmitted from the server; and
a measuring instrument operating step of operating a measuring instrument for measurement on the target device to measure the state of the target device based on the information for restoration of the target device,
the server executing:
a fixing target information receiving step of receiving the information about the trouble in the target device;
a trouble analyzing step of referring to a fixing know-how database to analyze the trouble occurring in the target device based on the information about the trouble in the target device, the fixing know-how database containing know-how information about fixing of the target device registered in advance; and
a transmission information selecting step of selecting information required for fixing of the target device from information for restoration specified based on a result of the analysis by the trouble analyzing step so as to comply with a selection condition set in advance, and transmitting the selected information to the first terminal device, wherein
the selection condition is set in such a manner that the information for restoration specified based on the result of the analysis performed in the trouble analyzing step is limited to information directly relating to fixing of the target device and excluding know-how and technical confidential information not opened to outsiders; and in the transmission information selecting step, information for instructing work to be done by an operator at an actual place and a substance of automatic operation to be performed by the first terminal device for making measurement on the target device are selected, and the selected information and substance are transmitted as the information required for fixing of the target device to the first terminal device.

7. A non-transitory computer-readable medium having stored thereon a program for causing a computer to realize the following functions, the computer constituting a server in a fixing system that comprises the server and a terminal device configured to allow communication with each other through a network, the server analyzing a trouble occurring in a target device, the terminal device measuring a state of the target device, the functions comprising:
   a fixing target information receiving function of receiving information about the trouble in the target device transmitted from the terminal device;
   a trouble analyzing function of referring to a fixing know-how database to analyze the trouble occurring in the target device based on the information about the trouble in the target device, the fixing know-how database containing know-how information about fixing of the target device registered in advance; and
   a transmission information selecting function of selecting information required for fixing of the target device from information for restoration specified based on a result of the analysis by the trouble analyzing function so as to comply with a selection condition set in advance, and transmitting the selected information to the terminal device, wherein
   the selection condition is set in such a manner that the information for restoration specified based on the result of the analysis by the trouble analyzing function is limited to information directly relating to fixing of the target device and excluding know-how and technical confidential information not opened to outsiders; and
   the transmission information selecting function selects information for instructing work to be done by an operator at an actual place and a substance of automatic operation to be performed by the terminal device for making measurement on the target device, and transmits the selected information as the information required for fixing of the target device to the terminal device.

8. A non-transitory computer-readable medium having stored thereon a program for causing a computer to realize the following functions, the computer constituting a terminal device in a fixing system that comprises a server and the terminal device configured to allow communication with each other through a network, the server analyzing a trouble occurring in a target device, the terminal device measuring a state of the target device, the functions comprising:
   a fixing target information transmitting function of transmitting information about the trouble in the target device to the server;
   a restoration information receiving function of receiving information for restoration of the target device transmitted from the server; and
   a measuring instrument operating function of operating a measuring instrument for measurement on the target device to measure the state of the target device based on the information for restoration of the target device, wherein
   the information for restoration of the target device is information required for fixing of the target device selected by the server from information for restoration specified based on a result of analysis by the server so as to comply with a selection condition set in advance, the analysis being to analyze the trouble occurring in the target device by referring to a fixing know-how database based on the information about the trouble in the target device, the fixing know-how database containing know-how information about fixing of the target device registered in advance;
   the selection condition is set in such a manner that the information for restoration specified based on the result of the analysis is limited to information directly relating to fixing of the target device and excluding know-how and technical confidential information not opened to outsiders; and
   information for instructing work to be done by an operator at an actual place and a substance of automatic operation to be performed by the terminal device for making measurement on the target device are selected.

* * * * *